United States Patent
Hashemi et al.

(10) Patent No.: US 11,316,104 B2
(45) Date of Patent: Apr. 26, 2022

(54) INVERTED WIDE BASE DOUBLE MAGNETIC TUNNEL JUNCTION DEVICE

(71) Applicant: International Business Machines Corporation, Armonk, NY (US)

(72) Inventors: Pouya Hashemi, Purchase, NY (US); Bruce B. Doris, Slingerlands, NY (US); Janusz Jozef Nowak, Highland Mills, NY (US); Jonathan Zanhong Sun, Shrub Oak, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 16/817,744

(22) Filed: Mar. 13, 2020

(65) Prior Publication Data

US 2021/0288246 A1 Sep. 16, 2021

(51) Int. Cl.
| | | |
|---|---|---|
| *H01L 43/12* | (2006.01) | |
| *H01L 27/22* | (2006.01) | |
| *H01L 43/02* | (2006.01) | |
| *H01L 43/10* | (2006.01) | |

(52) U.S. Cl.
CPC ............ *H01L 43/12* (2013.01); *H01L 27/222* (2013.01); *H01L 43/02* (2013.01); *H01L 43/10* (2013.01)

(58) Field of Classification Search
CPC ......... H01L 43/12; H01L 43/02; H01L 43/10; H01L 27/222
USPC ........................................................ 257/421
See application file for complete search history.

(56) References Cited

U.S. PATENT DOCUMENTS

| | | |
|---|---|---|
| 6,469,926 B1 | 10/2002 | Chen |
| 6,822,838 B2 | 11/2004 | Lin et al. |
| 7,576,956 B2 | 8/2009 | Huai |
| 9,093,640 B2 | 7/2015 | Aggarwal et al. |
| 9,236,565 B2 | 1/2016 | Loong et al. |
| 9,460,768 B2 | 10/2016 | Manipatruni et al. |
| 10,784,440 B2* | 9/2020 | Tseng ....................... A61K 8/55 |
| 10,803,916 B2* | 10/2020 | Bozdag ............... G11C 11/1675 |
| 10,923,648 B2* | 2/2021 | Ahmed ............... H01F 10/3254 |
| 2007/0171694 A1 | 7/2007 | Huai et al. |
| 2016/0064652 A1 | 3/2016 | Guo |
| 2018/0226574 A1 | 8/2018 | Whig et al. |
| 2019/0006583 A1 | 1/2019 | Tahmasebi |
| 2019/0088713 A1 | 3/2019 | Swerts |
| 2019/0131517 A1* | 5/2019 | Shiokawa ............... H01L 43/02 |

(Continued)

FOREIGN PATENT DOCUMENTS

| | | |
|---|---|---|
| CN | 103107281 A | 5/2013 |
| CN | 104584134 A | 4/2015 |

(Continued)

OTHER PUBLICATIONS

International Search Report and Written Opinion, International Application No. PCT/IB2021/050787, dated May 7, 2021, 10 pages.

*Primary Examiner* — Tu-Tu V Ho

(74) *Attorney, Agent, or Firm* — Jeffrey M. Ingalls

(57) ABSTRACT

A method of manufacturing a double magnetic tunnel junction device is provided. The method includes forming a first magnetic tunnel junction stack, forming a spin conducting layer on the first magnetic tunnel junction stack, and forming a second magnetic tunnel junction stack on the spin conducting layer. The second magnetic tunnel junction stack has a width that is greater than a width of the first magnetic tunnel junction stack.

18 Claims, 12 Drawing Sheets

(56) References Cited

U.S. PATENT DOCUMENTS

| | | | |
|---|---|---|---|
| 2019/0148625 A1* | 5/2019 | Tseng | A61K 8/731 |
| | | | 365/158 |
| 2019/0206472 A1* | 7/2019 | Bozdag | G11C 11/1675 |
| 2019/0334080 A1 | 10/2019 | Ahmed et al. | |
| 2020/0028069 A1 | 1/2020 | Nguyen et al. | |
| 2021/0057639 A1* | 2/2021 | Ku | H01L 43/02 |

FOREIGN PATENT DOCUMENTS

| | | |
|---|---|---|
| CN | 107210360 A | 9/2017 |
| CN | 110164902 A | 8/2019 |
| CN | 110660435 A | 1/2020 |
| TW | 202036944 A | 10/2020 |

* cited by examiner

US 11,316,104 B2

INVERTED WIDE BASE DOUBLE MAGNETIC TUNNEL JUNCTION DEVICE

BACKGROUND

The present disclosure relates to magnetoresistive random-access ("MRAM") memory device cells including double magnetic tunnel junction ("DMTJ") stacks and methods of manufacturing MRAM devices. Tunnel magnetoresistance ("TMR") and write efficiency are factors that affect the performance of MRAM devices, and certain DMTJ devices can suffer from a low magnetoresistance ratio.

SUMMARY

Embodiments of the present disclosure relate to a method of manufacturing a double magnetic tunnel junction device. The method includes forming a first magnetic tunnel junction stack, forming a spin conducting layer on the first magnetic tunnel junction stack, and forming a second magnetic tunnel junction stack on the spin conducting layer. The second magnetic tunnel junction stack has a width that is greater than a width of the first magnetic tunnel junction stack.

Other embodiments relate to a double magnetic tunnel junction device. A double magnetic tunnel junction device includes a first magnetic tunnel junction stack, a spin conducting layer on the first magnetic tunnel junction stack, and a second magnetic tunnel junction stack on the spin conducting layer. The second magnetic tunnel junction stack has a width that is greater than a width of the first magnetic tunnel junction stack.

The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
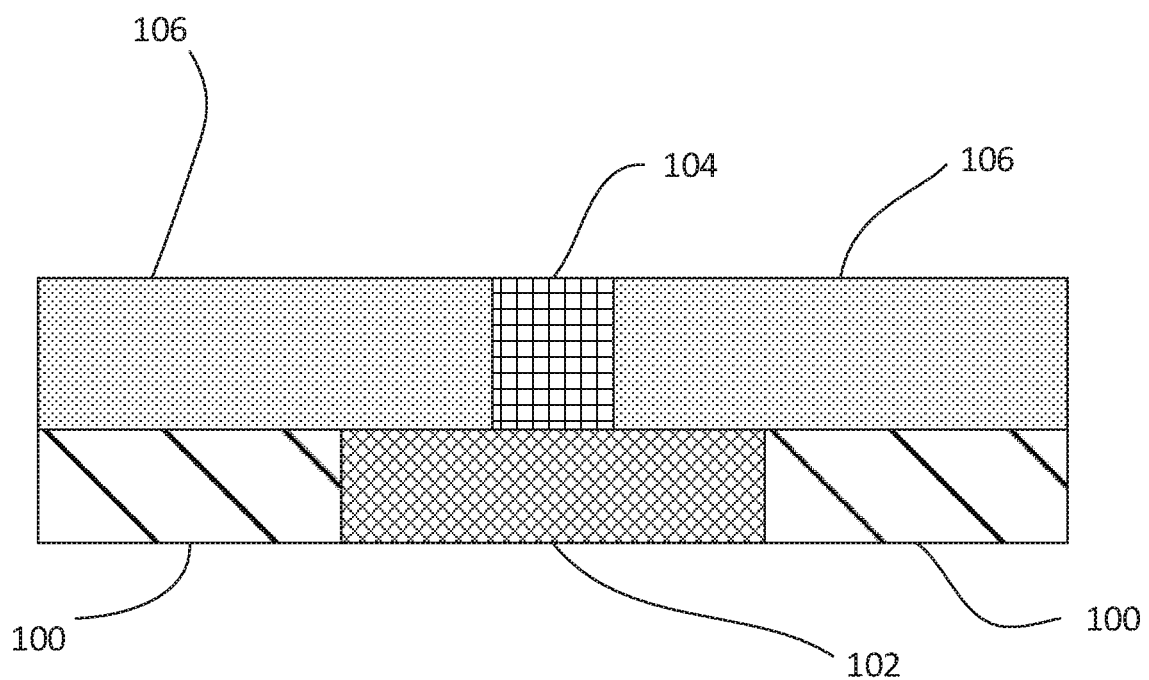
FIG. 1 is a cross-sectional view of back end of line base layers that are formed underneath a double magnetic tunnel junction (DMTJ) stack, according to embodiments.

The present disclosure describes MRAM devices including double magnetic tunnel junction ("DMTJ") stacks and methods of manufacturing MRAM devices. In particular, the present disclosure describes a single bit MRAM device with two MJTs stacked vertically with an inverted wide base (i.e., where the top MTJ stack has a larger critical dimension ("CD") than the bottom MTJ stack).

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping, and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma-enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etching processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light-sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, embedded DRAM ("eDRAM") is a dynamic random-access memory ("DRAM") integrated on the same die or multi-chip module ("MCM") of an application-specific integrated circuit ("ASIC") or microprocessor. eDRAM has been implemented in silicon-on-insulator ("SOI") technology, which refers to the use of a layered silicon-insulator-silicon substrate in place of conventional silicon substrates in semiconductor manufacturing. eDRAM technology has met with varying degrees of success, and demand for SOI technology as a server memory option has decreased in recent years.

Magnetoresistive random-access memory ("MRAM") devices using magnetic tunnel junctions ("MTJ") are one option to replace existing eDRAM technologies. MRAM is a non-volatile memory, and this benefit is a driving factor that is accelerating the development of this memory technology. Current MRAM MTJ structures are relatively slow, and the only way to reach MTJ write target speeds comparable to eDRAM (~5 ns) is with double magnetic tunnel junctions ("DMTJ").

In certain DMTJ devices, a wide non-magnetic base modified DMTJ device is used to increase the MTJ's switching efficiency by eliminating both the resistance area ("RA") penalty and magnetoresistance ("MR") penalty that are both associated with standard DMTJs that have top and bottom MTJs with similar critical-dimensions ("CD"). These types of wide-based devices provide double spin-current sourcing ("DSTT") benefits. Also, for these types of devices, the bottom barrier layer can have a relatively high RA. Certain of these devices leverage spin-diffusion transport in a non-magnetic ("NM") metal layer that is provided between the two MTJ stacks, and they can achieve a reduction in the charge current density through the bottom MgO layer. However, in certain of these wide base DMTJ devices, each of the MTJ stacks include a reference layer. The combination of the two separate reference layers and the intermediate NM layer results in a taller DMTJ stack, which increases the complexity of the manufacturing process and may lead to electrical shorts across the barrier.

The present embodiments include DMJT structures and methods of fabricating DMTJ structures where one of the MTJ stacks has a wider base than the other. In certain of these embodiments, the MRAM device includes a DMTJ structure with an inverted structure (i.e., where the top MTJ stack has a larger critical dimension ("CD") than the bottom MTJ stack).

Referring now to the drawings in which like numerals represent the same or similar elements and initially to FIG. 1, an exemplary method of manufacturing a DMTJ stack to which the present embodiments may be applied is shown. Several back end of line ("BEOL") layers are formed. In general, the BEOL is the second portion of IC fabrication where the individual devices (transistors, capacitors, resistors, etc.) are interconnected with wiring on the wafer. As shown in FIG. 1, a first BEOL layer includes a BEOL metal layer 102 and a BEOL dielectric layer 100. The BEOL metal layer 102 can include, for example, Cu, TaN, Ta, Ti, TiN or a combination thereof. A BEOL dielectric layer 100 is formed on the sides of the BEOL metal layer 102. The BEOL dielectric layer 100 may be composed of, for example, $SiO_x$, $SiN_x$, SiBCN, low-κ, NBLOK, or any other suitable dielectric material.

Another BEOL layer is formed on the BEOL metal layer 102 and the BEOL dielectric layer 100. In particular, a via fill layer 104 is formed on the BEOL metal layer 102, and a via dielectric layer 106 is formed on the sides of the via fill layer 104. Initially, the via dielectric layer 106 may be formed by patterning via lithography. Then, a via is formed in the via dielectric layer 106 by, for example, RIE to remove a space for subsequent filling with the via fill layer 104. In certain embodiments, the via fill layer 104 may include a material such as W, Cu, TaN, Ta, Ti, TiN, TiOCN, TaOCN, or a combination of these materials. The via fill layer 104 can be formed by CVD, PVD, ALD or a combination thereof. After the via fill layer 104 is formed, the structure is subjected to, for example, CMP to planarize the surface for further processing. The structure including the BEOL layers shown in FIG. 1 is a starting structure upon which the MTJ stacks are to be formed.

Figure 2:
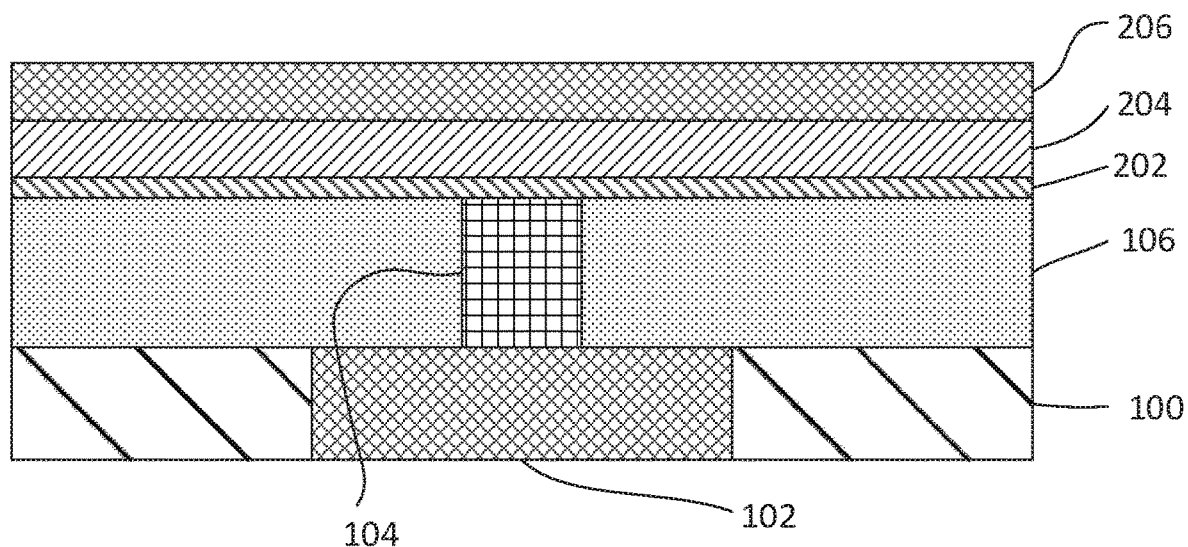
FIG. 2 is a cross-sectional view of the DMTJ device of FIG. 1 after additional fabrication operations, according to embodiments.

Referring now to FIG. 2, a seed layer 202 is formed on the via dielectric layer 106. The seed layer 202 has a crystal lattice and grain structure that is suitable as a growth surface for the free layer of the first MTJ stack 204. The seed layer 202 can be a metal seed layer composed of Ru, Ta, NiCr or a combination of these materials, for example.

Referring again to FIG. 2, a first MTJ stack 204 is formed on the seed layer. In general, an MTJ stack may include a magnetic free layer, a tunnel barrier layer and a reference layer (not shown). In general, the magnetic free layers have a magnetic moment or magnetization that can be flipped. In certain embodiments, the tunnel barrier layer is a barrier, such as a thin insulating layer or electric potential, between two electrically conducting materials. Electrons (or quasi-particles) pass through the tunnel barrier by the process of quantum tunneling. In certain embodiments, the tunnel barrier layer includes at least one sublayer composed of MgO. In certain embodiments, each layer of the MTJ stack may have a thickness less than an angstrom to a thickness of several angstroms or nanometers. Examples of typical materials in an MTJ stack can include MgO for the tunnel barrier layer, CoFeB for the free layer, and a plurality of layers comprised of different materials for the reference layer. It should be appreciated that the MRAM material stack (MTJ stack) is not limited to these materials or the layers described above. That is, the MRAM material stack can be composed of any known stack of materials used in MRAM devices. Moreover, it should be appreciated that either of the first MTJ stack 204 and the second MTJ stack 704 (see, FIG. 7) may include additional layers, omit certain layers, and each of the layers may include any number of sublayers. Moreover, the composition of layers and/or sublayers may be different between the first MTJ stack 204 and the second MTJ stack 704 (see, FIG. 7).

As shown in FIG. 2, a non-magnetic spin conducting layer 206 is formed on the first MTJ stack 204. The spin conducting layer 206 is formed between the first MTJ stack 204 and the second MTJ stack 704 (see, FIG. 7), and in certain examples may be comprised of Cu, CuN, Ag, AgSn or combinations thereof. In general, a function of the spin conducting layer 206 is to collect the spin current from the tunnel barrier layer of the first MTJ stack 204.

Figure 3:
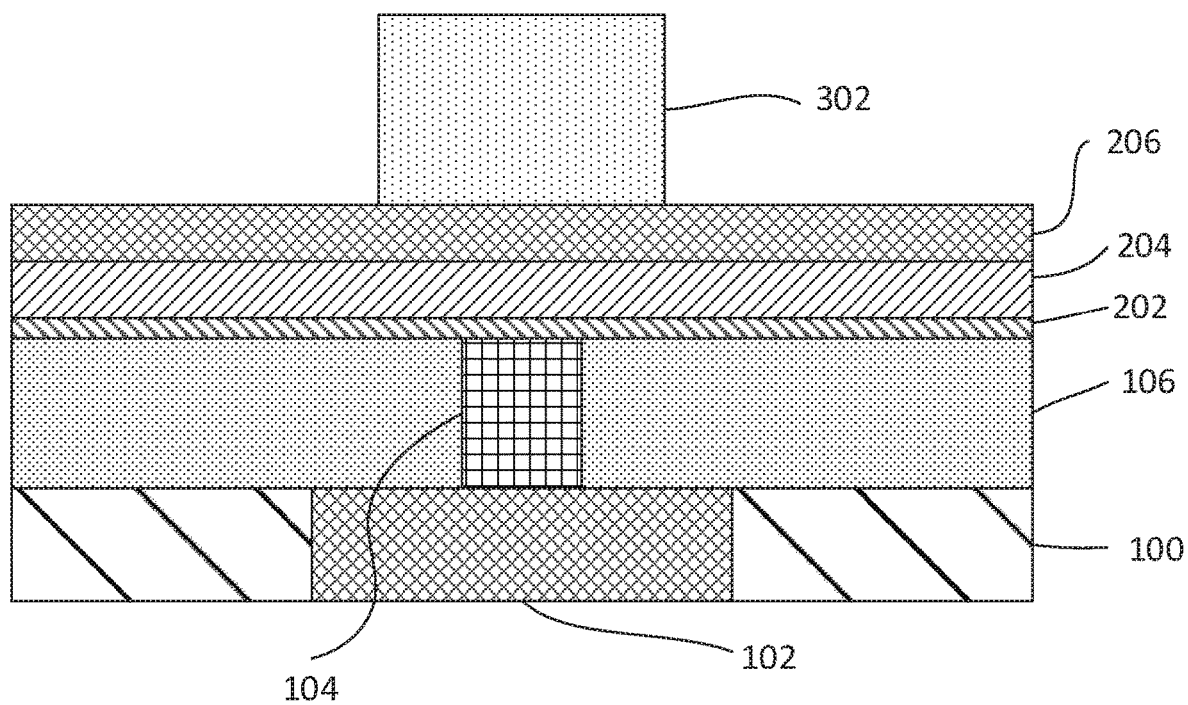
FIG. 3 is a cross-sectional view of the DMTJ device of FIG. 2 after additional fabrication operations, according to embodiments.

Referring now to FIG. 3, a sacrificial dielectric/organic hardmask stack 302 is deposited on the spin conducting layer 206, and the hardmask stack 302 is subsequently patterned by lithography and RIE. In certain embodiments, the hardmask stack 302 is composed of an organic planarization layer ("OPL") material, $SiN_x$, $SiO_x$, photoresist, or a combination thereof.

Figure 4:
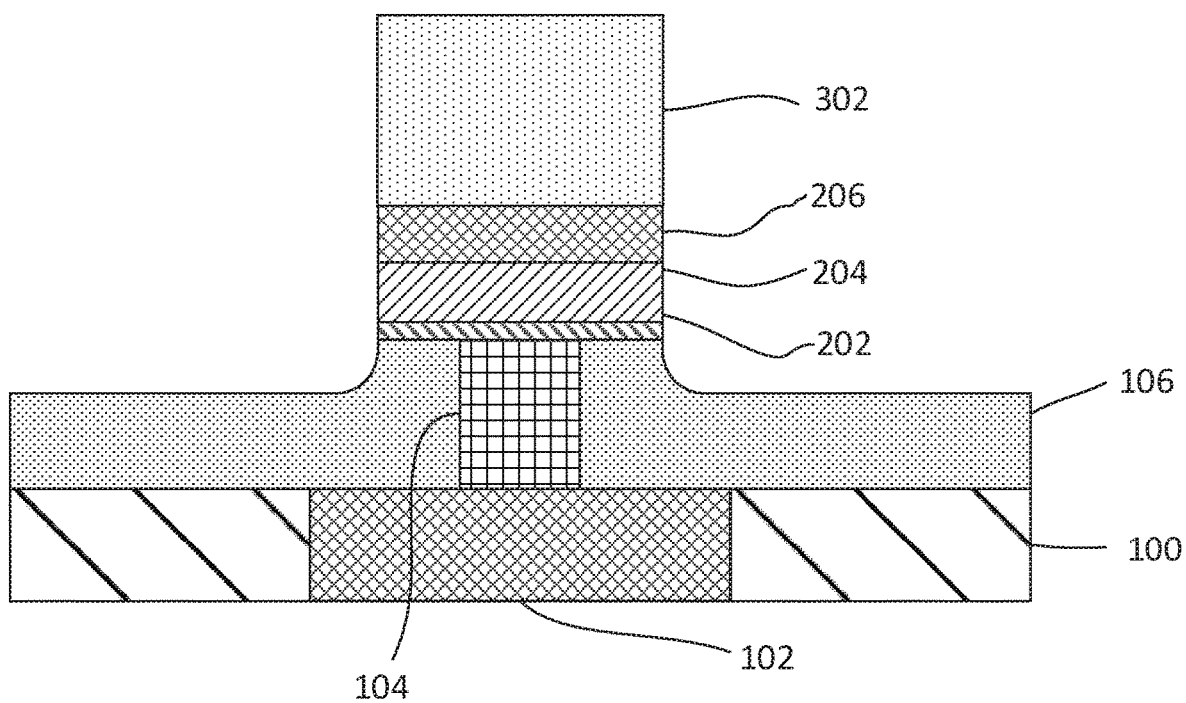
FIG. 4 is a cross-sectional view of the DMTJ device of FIG. 3 after additional fabrication operations, according to embodiments.

Referring now to FIG. 4, the first MTJ stack 204 is patterned with IBE or RIE while utilizing the sacrificial dielectric/organic hardmask stack 302 for the pattern. As shown in FIG. 4, the etching is stopped inside (or near the top of) the via dielectric layer 106. Thus, after the etching procedure, the widths of the spin conducting layer 206, the first MTJ stack 204 and the seed layer 202 have been reduced. In certain embodiments, at this stage of the manufacturing process, an air-break can be utilized (i.e., after the formation of the spin conducting layer 206). In certain embodiments, controlled in-situ oxidation can be utilized to remove partial electrical shorts due to metallic redeposition.

Figure 5:
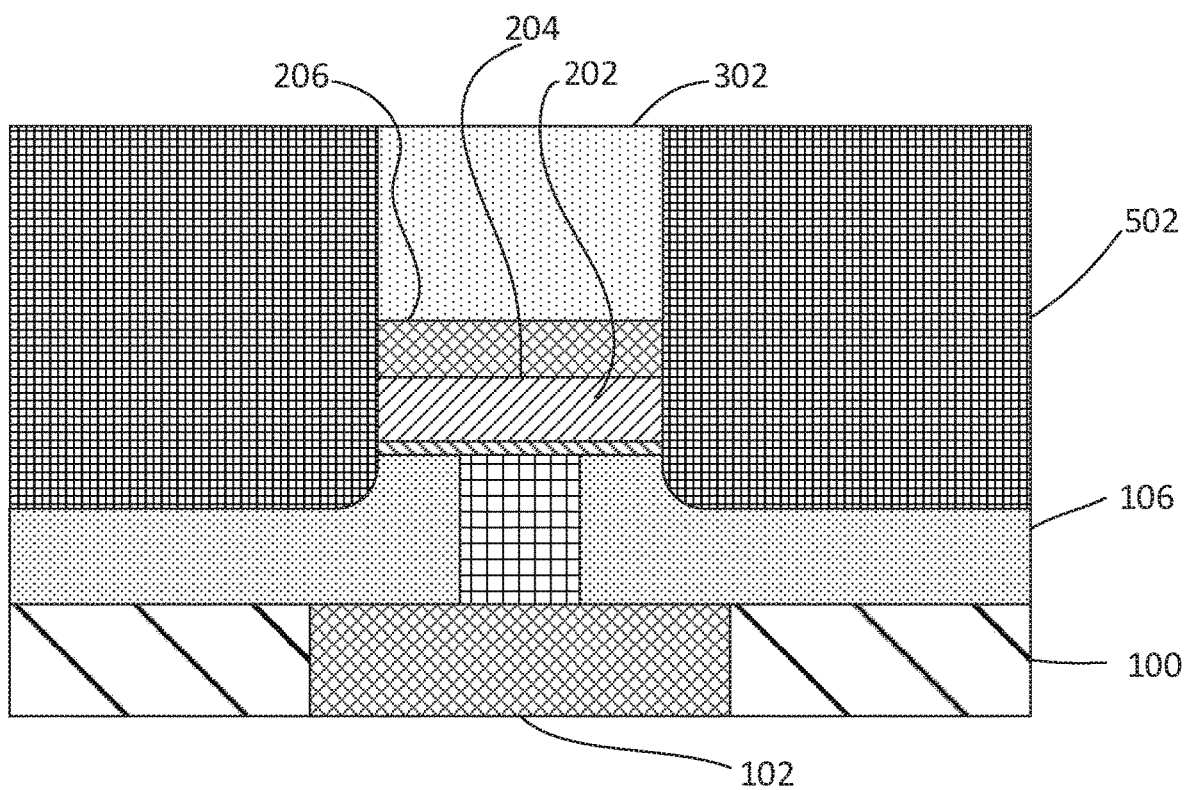
FIG. 5 is a cross-sectional view of the DMTJ device of FIG. 4 after additional fabrication operations, according to embodiments.

Referring now to FIG. 5, a first dielectric layer 502 is deposited. This first dielectric layer 502 may be composed of SiN, SiBCN, a combination thereof, or any other suitable dielectric material. As shown in FIG. 5, the first dielectric layer 502 is deposited to a sufficient height to at least cover the sidewalls of the spin conducting layer 206, the first MTJ stack 204, and the seed layer 202. In certain embodiments, the first dielectric layer 502 is formed initially up to about the level of the top surface of the sacrificial dielectric/organic hardmask stack 302.

Figure 6:
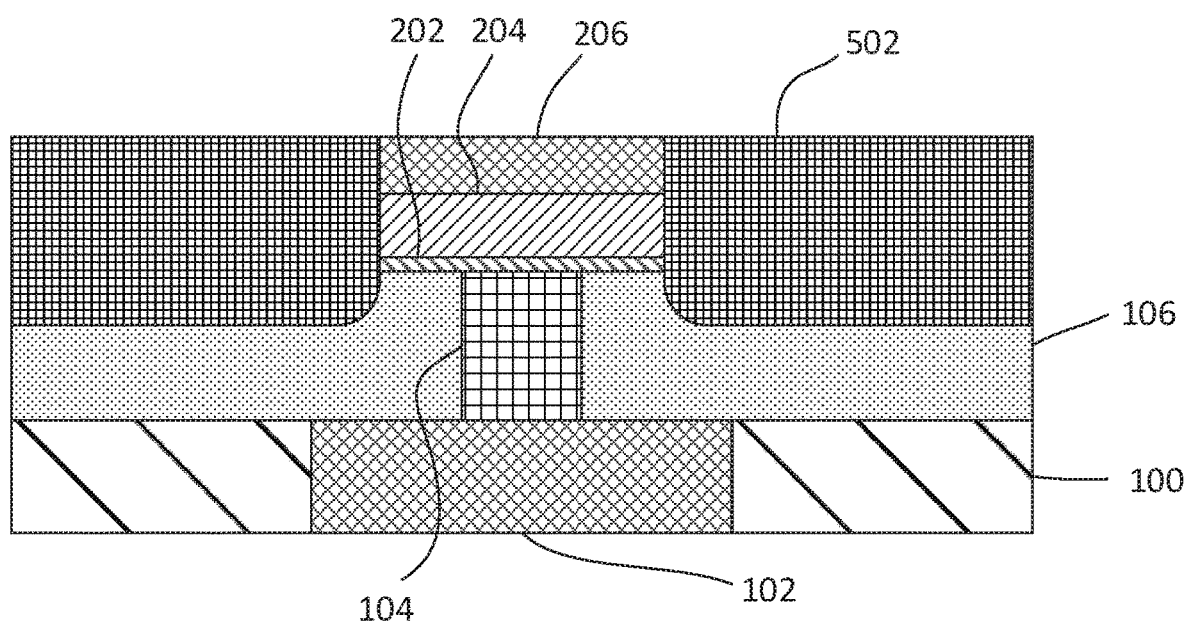
FIG. 6 is a cross-sectional view of the DMTJ device of FIG. 5 after additional fabrication operations, according to embodiments.

Referring now to FIG. 6, CMP is performed on the device to remove part of the thickness of the recently deposited first dielectric layer 502. The CMP is performed down to the point where the entire sacrificial dielectric/organic hardmask stack 302 is removed, and to generally coincide with the upper surface of the spin conducting layer 206. That is, enough material is removed to expose the upper surface of the spin conducting layer 206.

Figure 7:
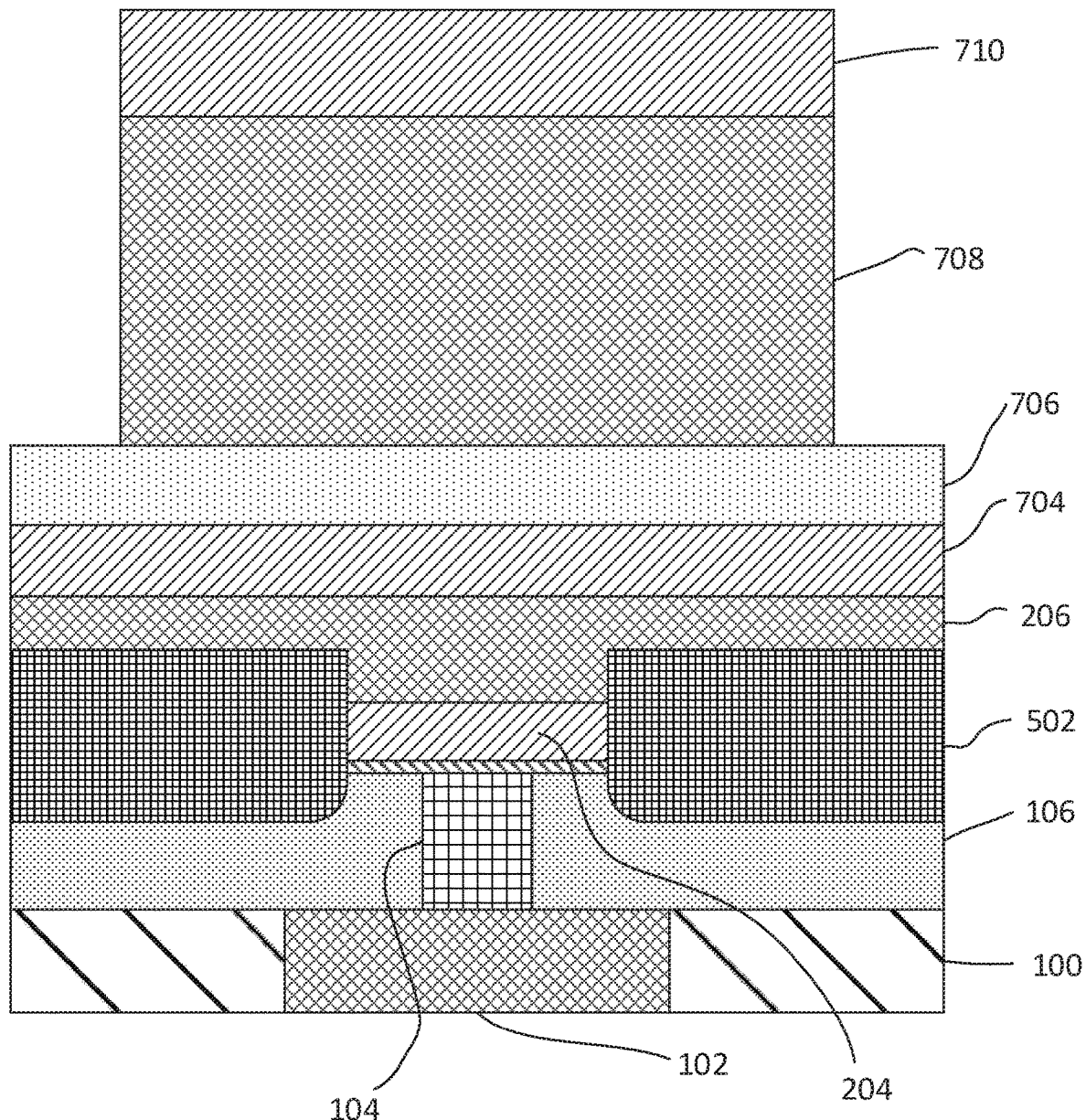
FIG. 7 is a cross-sectional view of the DMTJ device of FIG. 6 after additional fabrication operations, according to embodiments.

Referring now to FIG. 7, the growth of the spin conducting layer 206 is continued to initially cover the entire surface of the device. It should be appreciated that although the spin conducting layer 206 is shown as a single layer, it is grown in two separate steps. Thus, the material of the upper portion of the spin conducting layer 206 may be the same as, or different from, the material of the lower portion of the spin conducting layer 206. In certain embodiments, before to the formation of the upper portion of the spin conducting layer 206, a pre-sputter cleaning may be performed to remove any native oxide material after the CMP discussed above with regard to FIG. 6. A second MTJ stack 704 is then formed on top of the spin conducting layer 206. The number and type of layers of the second MTJ stack 704 may be the same as, or different from, the layers in the first MTJ stack 204. A metal etch stop layer 706 is then formed on the second MTJ stack 704. The metal etch stop layer 706 may be composed of Ru or any other suitable metal or alloy. A top electrode metal hardmask layer 708 is then formed on the metal etch stop layer 706. The top electrode metal hardmask layer 708 may be composed of W, TaN, TiN, a combination thereof, or any other suitable materials. A second sacrificial dielectric/organic hardmask stack 710 is then formed on the top electrode metal hardmask layer 708. The second sacrificial dielectric/organic hardmask stack 710 may be formed of the same or different materials as the first sacrificial dielectric/organic hardmask stack 302 discussed above with regard to FIG. 3 (e.g., OPL, $SiN_x$, $SiO_x$, photoresist, etc.). Finally, as shown in FIG. 7, the top electrode metal hardmask layer 708 and the second sacrificial dielectric/organic hardmask stack 710 are patterned by lithography and RIE, and the width of these layers is wider than the width of the previously formed first MTJ stack 204.

Figure 8:
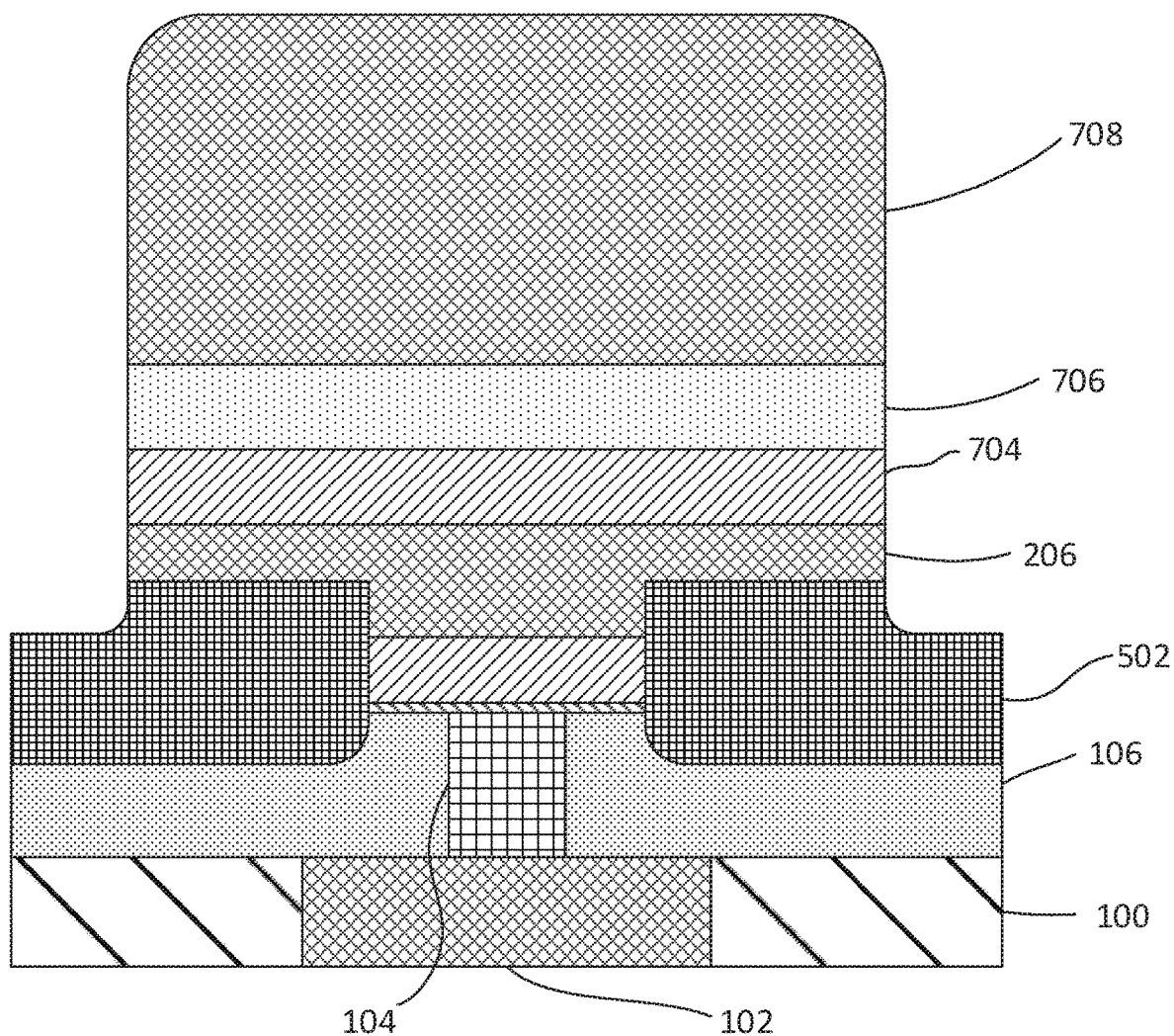
FIG. 8 is a cross-sectional view of the DMTJ device of FIG. 7, according to embodiments.

Referring now to FIG. 8, the second MTJ stack 704 is patterned by IBE, RIE or a combination thereof utilizing the second sacrificial dielectric/organic hardmask stack 710 as a mask. Thus, the width of the second MTJ stack 704, and the upper portion of the spin conducting layer 206 have been reduced to be approximately the same as the width of the second sacrificial dielectric/organic hardmask stack 710. As shown in FIG. 8, the device is etched down to a level that is inside (e.g., near the top) of the first dielectric layer 502. Even after this removal step, the width of the second MTJ stack 704 is still greater than the width of the first MTJ stack 204. In certain embodiments, at this stage of the manufacturing process, an air-break can be utilized. In certain embodiments, controlled in-situ oxidation can be utilized to remove partial electrical shorts due to metallic redeposition near the MgO tunnel barrier layer (not shown) of the second MTJ stack 704.

Figure 9:
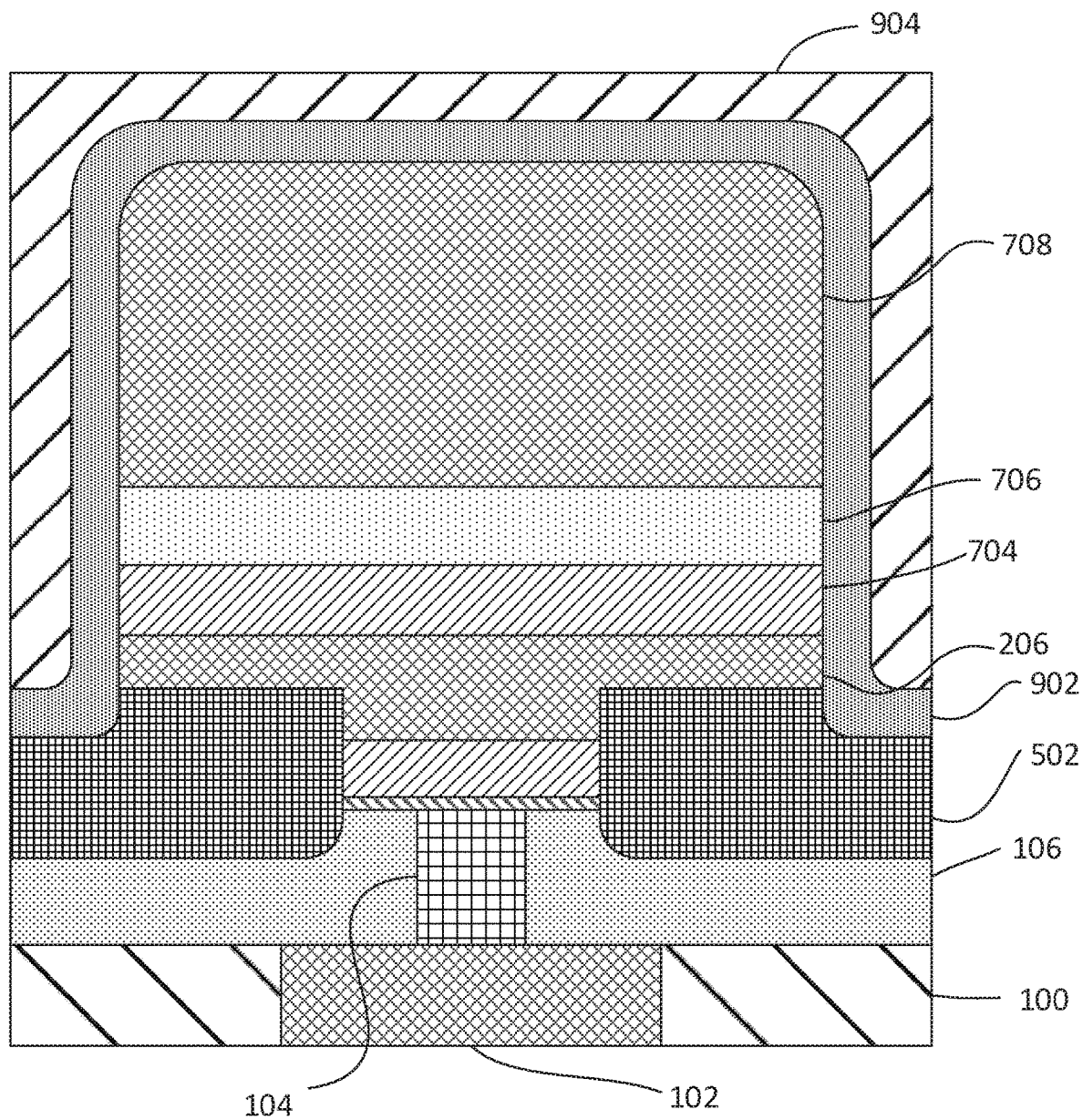
FIG. 9 is a cross-sectional view of the DMTJ device of FIG. 8, according to embodiments.

Referring now to FIG. 9, a dielectric encapsulation layer 902 is formed to cover the exposed surfaces of the spin conducting layer 206, the second MTJ stack 704, the metal etch stop layer 706, and the top electrode metal hardmask layer 708. For example, the dielectric encapsulation layer may comprise at least one of PVD, ALD, PECVD, AlOx, $TiO_x$, BN, SiN and SiBCN. In certain embodiments, following the formation of the dielectric encapsulation layer 902, the device can be subjected to an optional pre-treatment utilizing, for example, plasma $O_2$, $H_2$, $N_2$, $NH_3$ or a combination thereof. Then, an interlayer dielectric layer 904 is deposited and formed to fill in the spaces between adjacent DMTJ devices.

Figure 10:
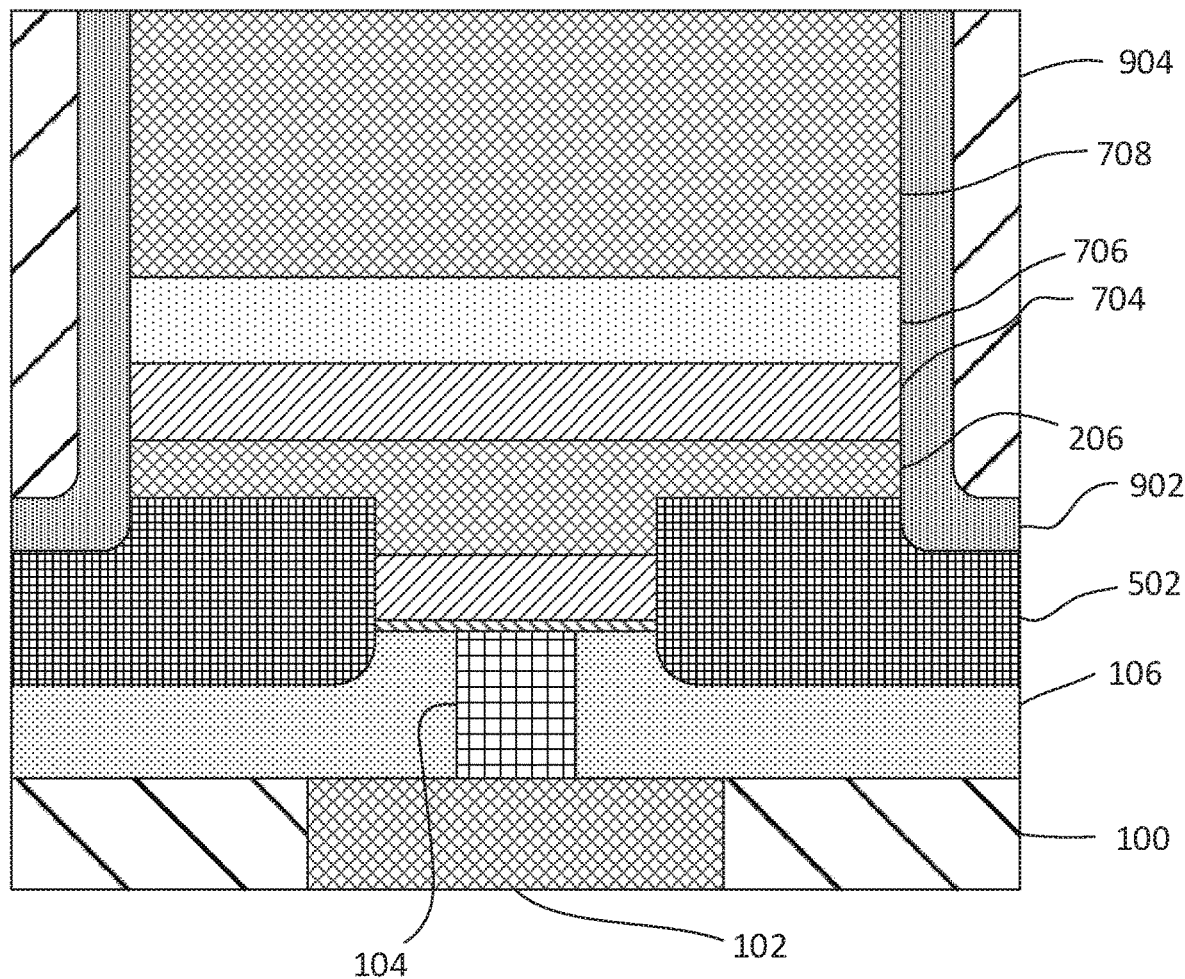
FIG. 10 is a cross-sectional view of the DMTJ device of FIG. 9, according to embodiments.
Figure 11:
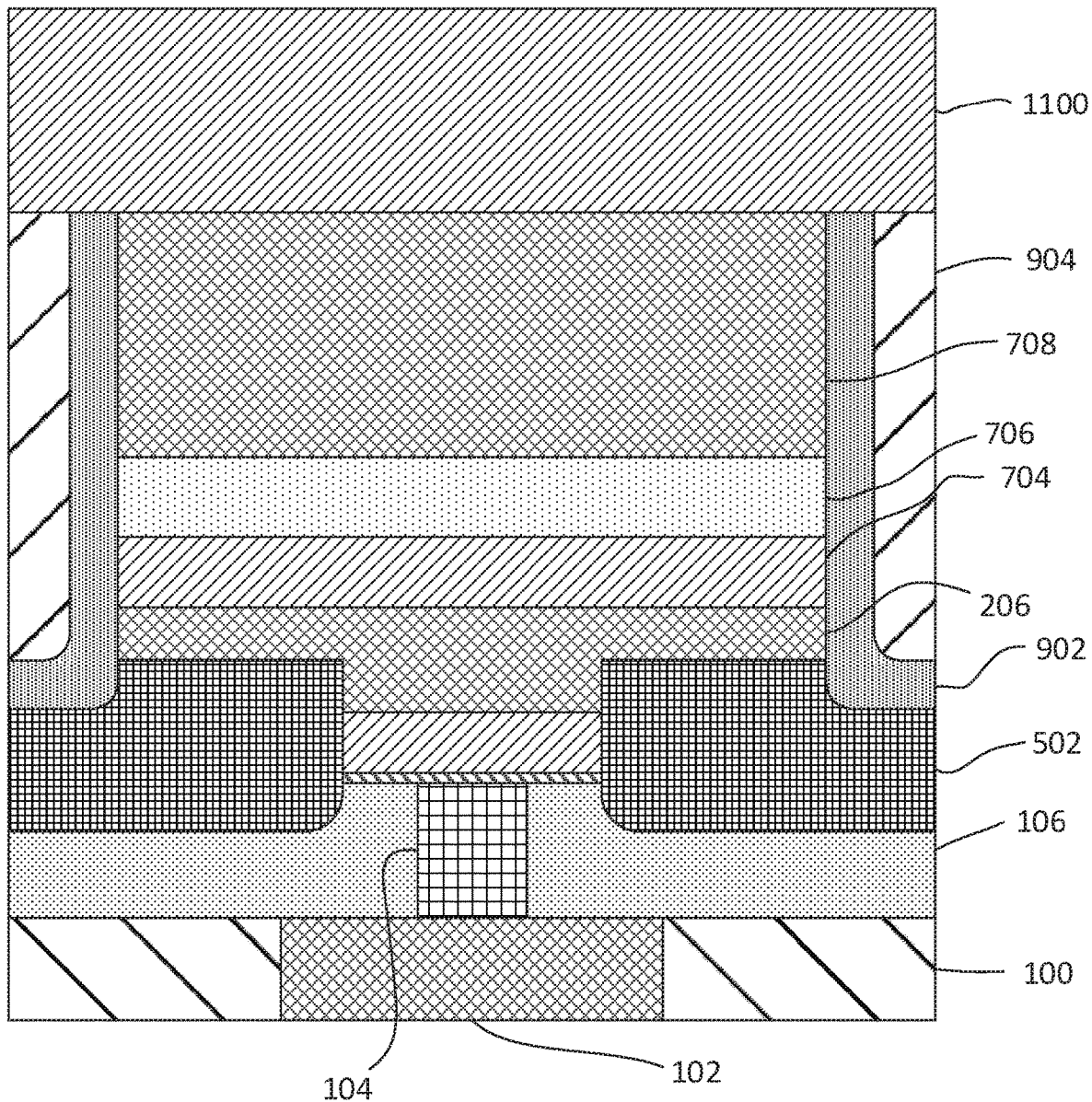
FIG. 11 is a cross-sectional view of the DMTJ device of FIG. 10, according to embodiments.
Figure 12:
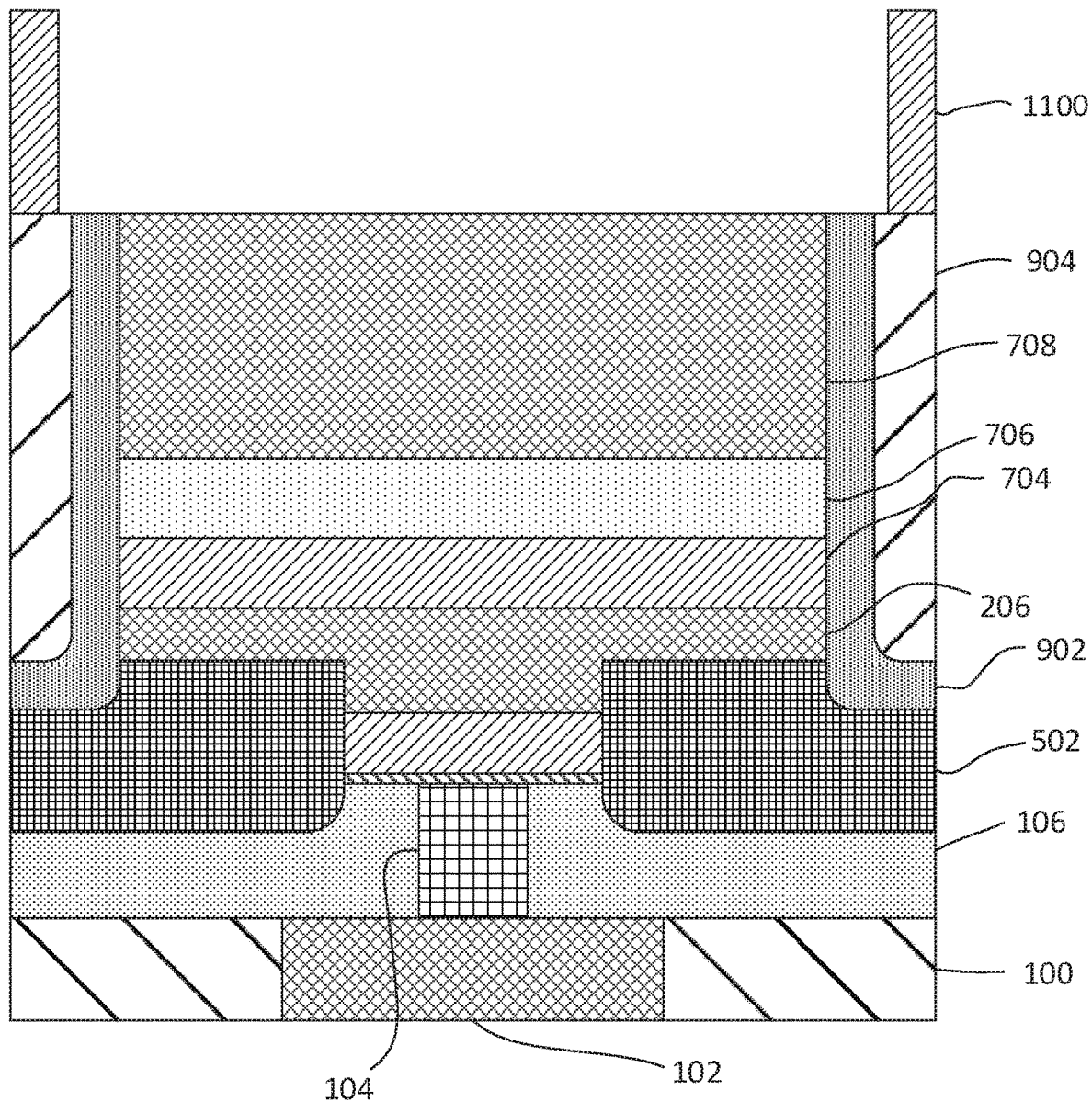
FIG. 12 is a cross-sectional view of the DMTJ device of FIG. 11, according to embodiments.
Figure 13:
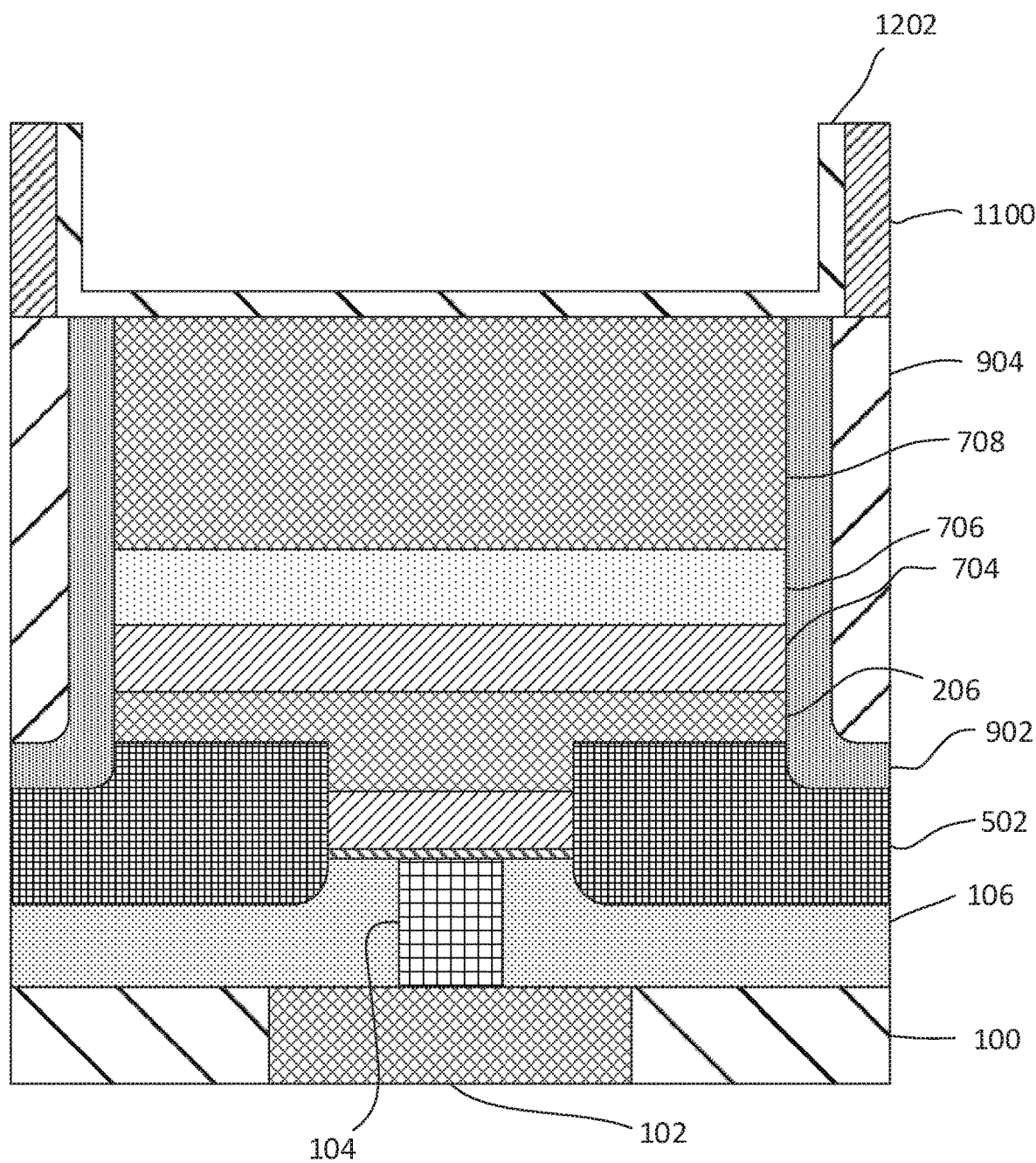
FIG. 13 is a cross-sectional view of the DMTJ device of FIG. 12, according to embodiments.
Figure 14:
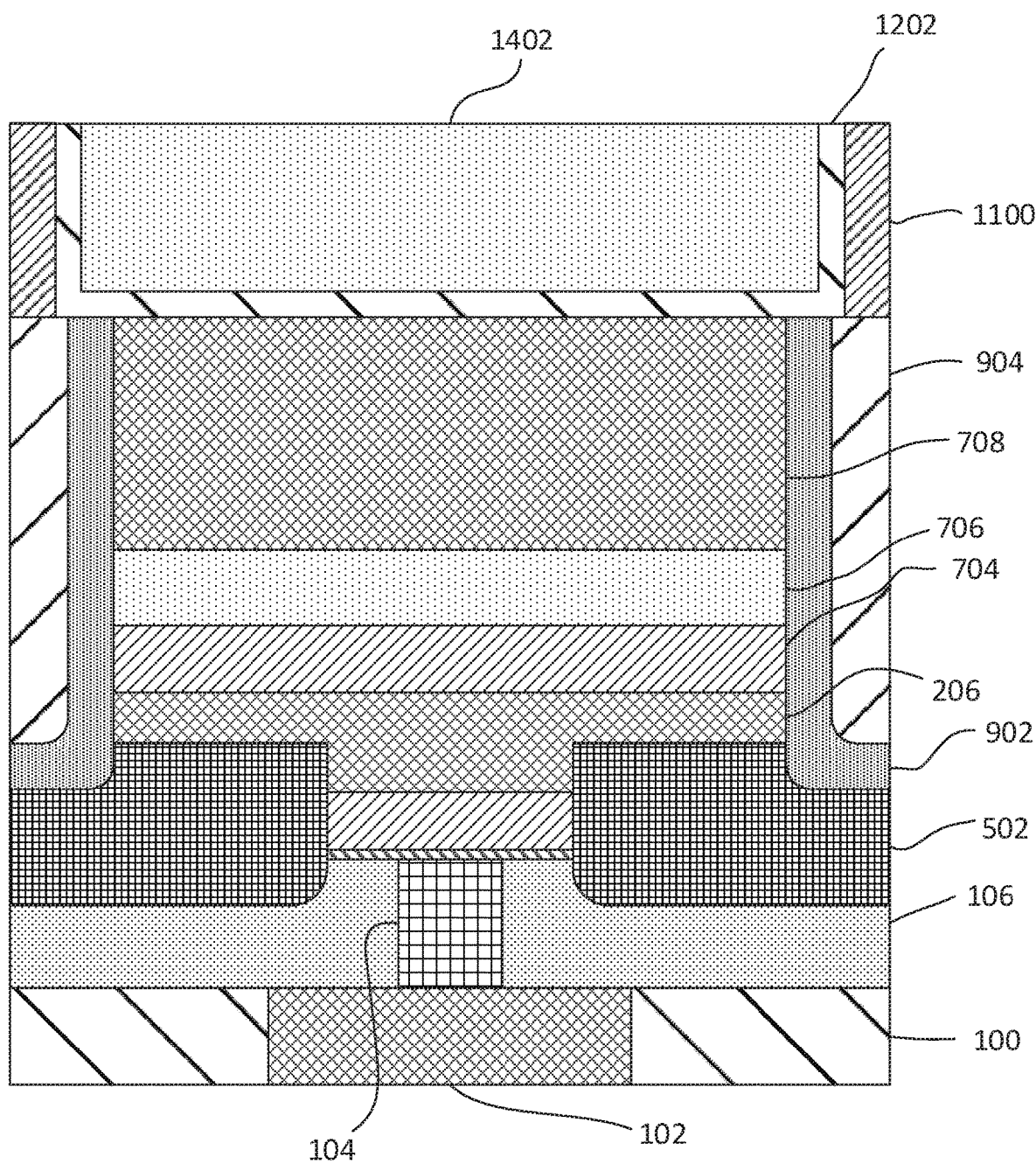
FIG. 14 is a cross-sectional view of the DMTJ device of FIG. 13, according to embodiments.

Referring now to FIG. 10, a CMP planarization process is performed on the device to expose upper surfaces of the top electrode hardmask layer 708 and the dielectric encapsulation layer 902. Referring now to FIG. 11, following the CMP planarization process, a second ILD layer 1100 is formed by lithography. Referring to FIG. 12, the second ILD layer 1100 is subjected to a removal process (e.g., RIE) to remove portions of the second ILD layer 1100 to once again expose portions of the top electrode hardmask layer 708 and the dielectric encapsulation layer 902. Referring now to FIG. 13, following the RIE process of FIG. 12, a fill liner 1202 is formed, followed by the formation of a bit-line 1402 shown in FIG. 14. In certain embodiments, the bit-line is composed of Ta, TaN, Cu, or any suitable combination thereof.

In the present embodiments, the DMTJ junction device can achieve an increase in the switching efficiency (which is proportional to the retention and inversely proportional to the switching current) relative to related single MTJ devices. Moreover, the present embodiments may achieve an increased magnetoresistance ratio which potentially reducing the switching current.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of manufacturing a double magnetic tunnel junction device, the method comprising:
    forming a first magnetic tunnel junction stack on a back end of line base layer;
    forming a spin conducting layer on the first magnetic tunnel junction stack; and
    forming a second magnetic tunnel junction stack on the spin conducting layer, the second magnetic tunnel junction stack having a width that is greater than a width of the first magnetic tunnel junction stack,
    wherein the first magnetic tunnel junction stack, the spin conducting layer and the second magnetic tunnel junction stack are aligned with each other in a vertical direction.

2. The method according to claim 1,
    wherein the first magnetic tunnel junction stack includes a first reference layer, a first tunnel barrier layer, and a first magnetic free layer, and
    wherein the second magnetic tunnel junction stack includes a second reference layer, a second tunnel barrier layer, and a second magnetic free layer.

3. The method according to claim 1, wherein, after forming the spin conducting layer, the method further comprises:
    forming a first dielectric layer on sides of the first magnetic tunnel junction stack and on sides of the spin conducting layer; and
    forming a second spin conducting layer on the spin conducting layer, the second spin conducting layer having a width that is greater than a width of the spin conducting layer and greater than the width of the first magnetic tunnel junction stack.

4. The method according to claim 3, wherein the second spin conducting layer is formed in direct contact with the spin conducting layer, and wherein the second spin conducting layer has a same material composition as the spin conducting layer.

5. The method according to claim 3, wherein, after forming the spin conducting layer, the method further comprises:
    forming a first dielectric layer on the sides of the first magnetic tunnel junction stack and on the sides of the spin conducting layer;
    forming a second spin conducting layer on the spin conducting layer and the first dielectric layer,
    forming the second magnetic tunnel junction stack on the second spin conducting layer;
    forming a metal etch-stop layer on the second magnetic tunnel junction stack;
    forming a metal hardmask layer on the metal etch-stop layer; and
    etching through the metal etch-stop layer, the second magnetic tunnel junction stack, the second spin conducting layer, and a portion of a thickness of the first dielectric layer,
    wherein the second spin conducting layer has a width that is the same as the width of the second magnetic tunnel junction stack.

6. The method according to claim 3, further comprising pre-treating exposed surfaces with at least one selected from the group consisting of plasma $O_2$, $H_2$, $N_2$ and $NH_3$ prior to forming the second spin conducting layer.

7. The method according to claim 1, wherein the spin conducting layer comprises at least one non-magnetic material selected from the group consisting of Cu, CuN, Ag and AgSn.

8. The method according to claim 1, further comprising forming a dielectric encapsulation layer on the second magnetic tunnel junction stack.

9. The method according to claim 8, wherein the dielectric encapsulation layer comprises at least one selected from the group consisting of AlOx, TiO$_x$, BN, SiN and SiBCN.

10. A double magnetic tunnel junction device comprising:
a first magnetic tunnel junction stack formed on a back end of line base layer;
a spin conducting layer on the first magnetic tunnel junction stack; and
a second magnetic tunnel junction stack on the spin conducting layer, the second magnetic tunnel junction stack having a width that is greater than a width of the first magnetic tunnel junction stack,
wherein the first magnetic tunnel junction stack, the spin conducting layer and the second magnetic tunnel junction stack are aligned with each other in a vertical direction.

11. The double magnetic tunnel junction device according to claim 10, further comprising a seed layer between the back end of line base layer and the first magnetic tunnel junction stack.

12. The double magnetic tunnel junction device according to claim 10,
wherein the first magnetic tunnel junction stack includes a first reference layer, a first tunnel barrier layer, and a first magnetic free layer, and
wherein the second magnetic tunnel junction stack includes a second reference layer, a second tunnel barrier layer, and a second magnetic free layer.

13. The double magnetic tunnel junction device according to claim 10, further comprising:
a first dielectric layer on sides of the first magnetic tunnel junction stack and on sides of the spin conducting layer; and
a second spin conducting layer on the spin conducting layer, the second spin conducting layer having a width that is greater than a width of the spin conducting layer and greater than the width of the first magnetic tunnel junction stack.

14. The double magnetic tunnel junction device according to claim 13, wherein the second spin conducting layer is in direct contact with the spin conducting layer, and wherein the second spin conducting layer has a same material composition as the spin conducting layer.

15. The double magnetic tunnel junction device according to claim 13, further comprising:
a first dielectric layer on the sides of the first magnetic tunnel junction stack and on the sides of the spin conducting layer;
a second spin conducting layer on the spin conducting layer, the second magnetic tunnel junction stack formed on the second spin conducting layer;
a metal etch stop layer on the second magnetic tunnel junction stack; and
a metal hardmask layer on the metal etch stop layer,
wherein the second spin conducting layer has a width that is the same as the width of the second magnetic tunnel junction stack.

16. The double magnetic tunnel junction device according to claim 10, wherein the spin conducting layer comprises at least one non-magnetic material selected from the group consisting of Cu, CuN, Ag and AgSn.

17. The double magnetic tunnel junction device according to claim 10, further comprising a dielectric encapsulation layer on the second magnetic tunnel junction stack.

18. The double magnetic tunnel junction device according to claim 17, wherein the dielectric encapsulation layer comprises at least one selected from the group consisting of AlOx, TiO$_x$, BN, SiN and SiBCN.

* * * * *